(12) United States Patent
Cho et al.

(10) Patent No.: US 7,417,887 B2
(45) Date of Patent: Aug. 26, 2008

(54) PHASE CHANGE MEMORY DEVICE AND METHOD OF DRIVING WORD LINE THEREOF

(75) Inventors: Beak-hyung Cho, Hwaseong-si (KR); Jong-soo Seo, Hwaseong-si (KR); Du-eung Kim, Yongin-si (KR); Woo-yeong Cho, Suwon-si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 0 days.

(21) Appl. No.: 11/303,910

(22) Filed: Dec. 19, 2005

(65) Prior Publication Data
US 2006/0256612 A1   Nov. 16, 2006

(30) Foreign Application Priority Data
May 12, 2005   (KR) ...................... 10-2005-0039721

(51) Int. Cl.
*G11C 11/00* (2006.01)
(52) U.S. Cl. ...................... 365/148; 365/163; 365/175; 365/230.06
(58) Field of Classification Search .................. 365/148, 365/163, 175, 230.06
See application file for complete search history.

(56) References Cited

U.S. PATENT DOCUMENTS

| 6,635,934 | B2 * | 10/2003 | Hidaka ........................ 257/369 |
| 6,667,900 | B2 * | 12/2003 | Lowrey et al. ............... 365/171 |
| 7,092,307 | B2 * | 8/2006 | Chen et al. ................... 365/226 |
| 7,123,535 | B2 * | 10/2006 | Kurotsuchi et al. ...... 365/225.7 |
| 2003/0002338 | A1 | 1/2003 | Xu et al. |
| 2003/0123284 | A1 | 7/2003 | Lowrey et al. |

FOREIGN PATENT DOCUMENTS

WO   WO 03/058632 A1   7/2003

* cited by examiner

*Primary Examiner*—Hoai V Ho
(74) *Attorney, Agent, or Firm*—Volentine & Whitt, P.L.L.C.

(57) ABSTRACT

A method and device for driving the word lines of a phase change memory device is provided. The method may include applying a first voltage level to non-selected word lines and a second voltage level to selected word lines during a normal operational mode, and placing the word lines in a floating state during a standby operational mode. The phase change memory device may include a plurality of word line drive circuits for driving corresponding word lines, where each of the plurality of word line drive circuits includes a drive unit which sets a corresponding word line to a first voltage level or a second voltage level in response to a first control signal, and a mode selector which selectively applies the first voltage level to the driving unit according to an operational mode of the phase change memory device.

14 Claims, 5 Drawing Sheets

PHASE CHANGE MEMORY DEVICE AND METHOD OF DRIVING WORD LINE THEREOF

BACKGROUND OF THE INVENTION

1. Field of the Invention

The present invention generally relates to phase change memory devices, and more particularly, the present invention relates to phase change memory devices and methods of driving word lines of phase change memory devices.

A claim of priority is made to Korean Patent Application No. 10-2005-0039721, filed May 12, 2005, in the Korean Intellectual Property Office, the entirety of which is incorporated herein by reference.

2. Description of the Related Art

Phase change random access memories (PRAMs) are non-volatile memory devices that store data using a phase change material, e.g., Ge—Sb—Te (GST). The phase change material, which exhibits different resistive values depending on the crystalline or amorphous phase thereof, is programmed by thermal treatment to set the phase of the material.

FIG. 1 illustrates an example of an equivalent circuit diagram of a unit memory cell C of a conventional phase change memory device. As shown, the unit memory cell C includes a P-N diode D and a phase change element GST connected in series between a bit line BL and a word line WL. In this example, the phase change element GST is connected between the bit line BL and a p-junction of the diode D.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

In a read operation, a given read current is provided to a selected memory cell, and the "1" or "0" resistive state of the memory cell is discriminated based on a voltage of the cell.

FIG. 2 is a simplified circuit diagram of a phase change memory device. As shown, the phase change memory device 100 includes a memory cell array CBLK, word line drive (WD) circuits 10-0~10-$n$-1, a bit line selection circuit 15, and peripheral circuits 17. Although not shown, the peripheral circuits 17 generally include a write driver circuit, a sense amplifier, and a data I/O buffer. The memory cell array CBLK includes an array of unit memory cells connected between corresponding bit lines BL0~BLm-1 and word lines WL0~WLn-1.

The bit line selection circuit 15 includes transistors for respectively selecting the bit lines BL0~BLm-1 in response to selection signals YL0~YLm-1.

In the examples given herein, a bit line is "selected" by changing its voltage to a high level, whereas a word line is "selected" by changing its voltage to a low level. In contrast, "non-selected" bit lines have a low level voltage, and "non-selected" word lines have a high level voltage.

FIG. 3 is a circuit diagram of the word line drive circuit 10-0 shown in FIG. 2. The remaining word line drive circuits 10-1~10-$n$-1 are similarly configured.

The word line drive circuit 10-0 includes a first NMOS transistor N1 connected between a ground voltage VSS and the word line WL0, and a first PMOS transistor P1 connected between the word line WL0 and a power voltage VCC. The gates of the transistors N1 and P1 are connected to receive a decoded signal DS from a row decoder (not shown).

Referring back to FIG. 2, assume that the unit memory cell at the intersection of word line WL0 and bit line BL1 is to be selected for writing or reading. In this case, the selected bit line BL1 is driven to a high level voltage and the remaining non-selected bit lines BL0, BL2~BL$_m$-1 are driven to a low level voltage. On the other hand, the selected word line WL0 is driven to a low level voltage and the remaining non-selected word lines WL1~WL$_n$-1 are driven to a high level voltage.

Referring additionally to FIG. 3, in order to select the word line, a high level decoded signal DS is applied to the word line driving circuit 10-0 so as to turn on the first NMOS transistor N1 and turn off the first PMOS transistor P1. As such, the selected word line WL0 goes to a low level. The decoding signal DS is a low level signal with respect to the remaining word lines WL1~WLn-1, and accordingly, the first PMOS transistor P1 is on and the first NMOS transistor N1 is off in each of the remaining word line drive circuits 10-1~10-$n$-1. As such, the remaining word lines WL1~WLn-1 are driven to a high level.

The phase change memory device described above suffers a drawback in that leakage current can result from maintaining each of the non-selected word lines WL1~WL$_n$-1 at a high level. In particular, excessive power is consumed as a result of the leakage current that occurs during a standby mode of the phase change memory device.

SUMMARY OF THE INVENTION

According to one aspect of the present invention, a method of driving a phase change memory device having a plurality of word lines is provided. The method includes applying a first voltage level to non-selected word lines and a second voltage level to selected word lines during a normal operational mode, and placing the word lines in a floating state during a standby operational mode.

According to another aspect of the present invention, a method of operating a phase change memory device in a standby operational mode is provided, where the phase change memory device include a plurality of word lines and a plurality of bit lines. The method includes applying a reference voltage to the bit lines and placing the word lines in a floating state during the standby operational mode.

According to yet another aspect of the present invention, a phase change memory device including a plurality of word line drive circuits for driving corresponding word lines is provided. Each of the plurality of word line drive circuits includes a drive unit which sets a corresponding word line to a first voltage level or a second voltage level in response to a first control signal, and a mode selector which selectively applies the first voltage level to the driving unit according to an operational mode of the phase change memory device.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF PREFERRED EMBODIMENTS

Figure 1:
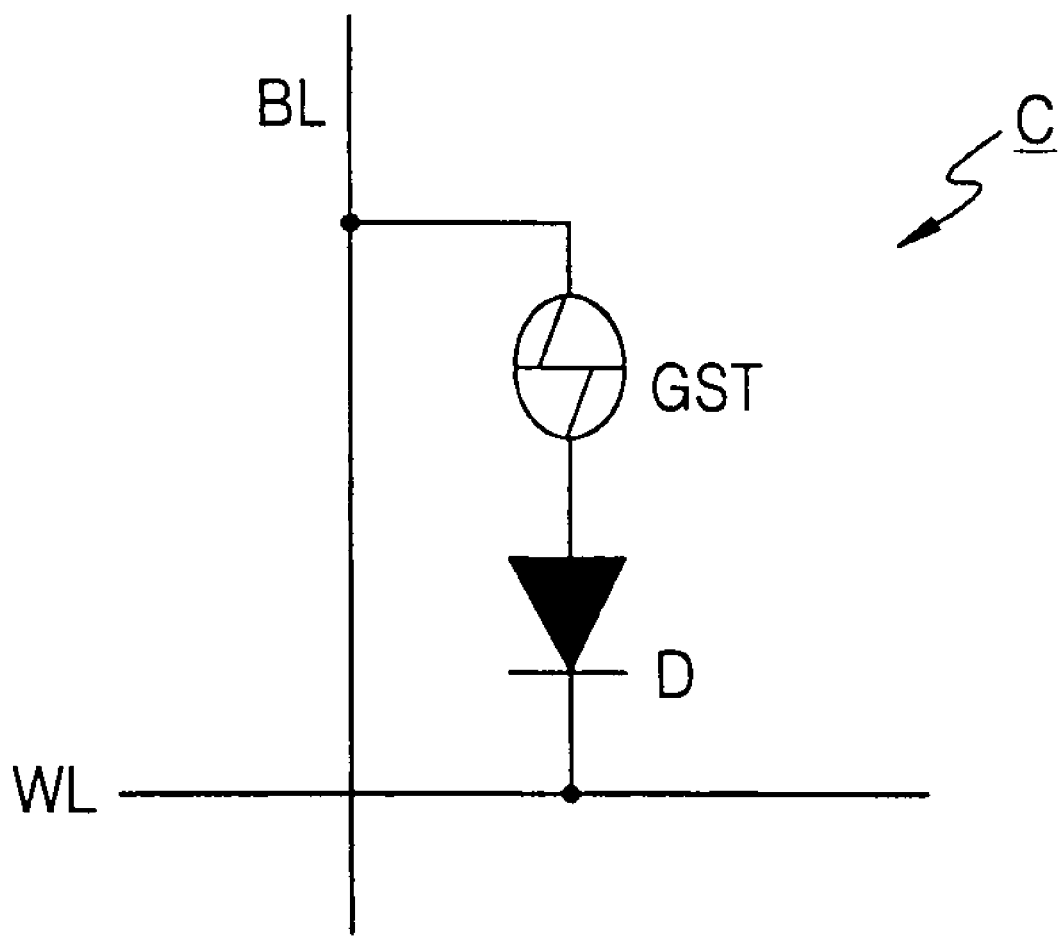
FIG. 1 is an equivalent circuit diagram of a unit memory cell in a conventional phase change memory device.

The present invention will now be described more fully with reference to the accompanying drawings, in which exemplary but non-limiting embodiments of the invention are shown. Throughout the drawings, like reference numerals refer to like elements.

Figure 4:
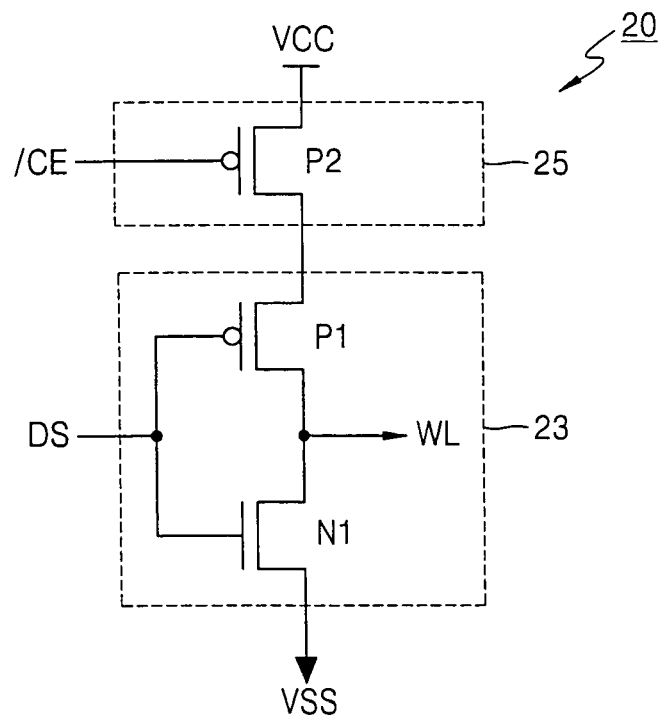
FIG. 4 is a circuit diagram of a word line drive circuit according to an embodiment of the present invention.

FIG. 4 is a circuit diagram of a word line drive circuit 20 according to an embodiment of the present invention. As shown, the word line drive circuit 20 includes a drive unit 23 and a mode selector 25.

In a normal operational mode, the drive unit 23 applies a first voltage level VCC or a second voltage level VSS to a corresponding word line WL in response to a first control signal DS. The mode selector 25 applies the first voltage level VCC to the driving unit 23 in the normal operational mode, and does not apply (or blocks) the first voltage level VCC to the drive unit 23 in a standby operational mode. In the standby operational mode, the corresponding word line WL is in a floating state.

The first voltage level VCC may be greater than the second voltage level VSS. For example, the first voltage level VCC may be a power supply voltage or less than a power voltage level, and the second voltage VSS may be a ground voltage.

Figure 2:
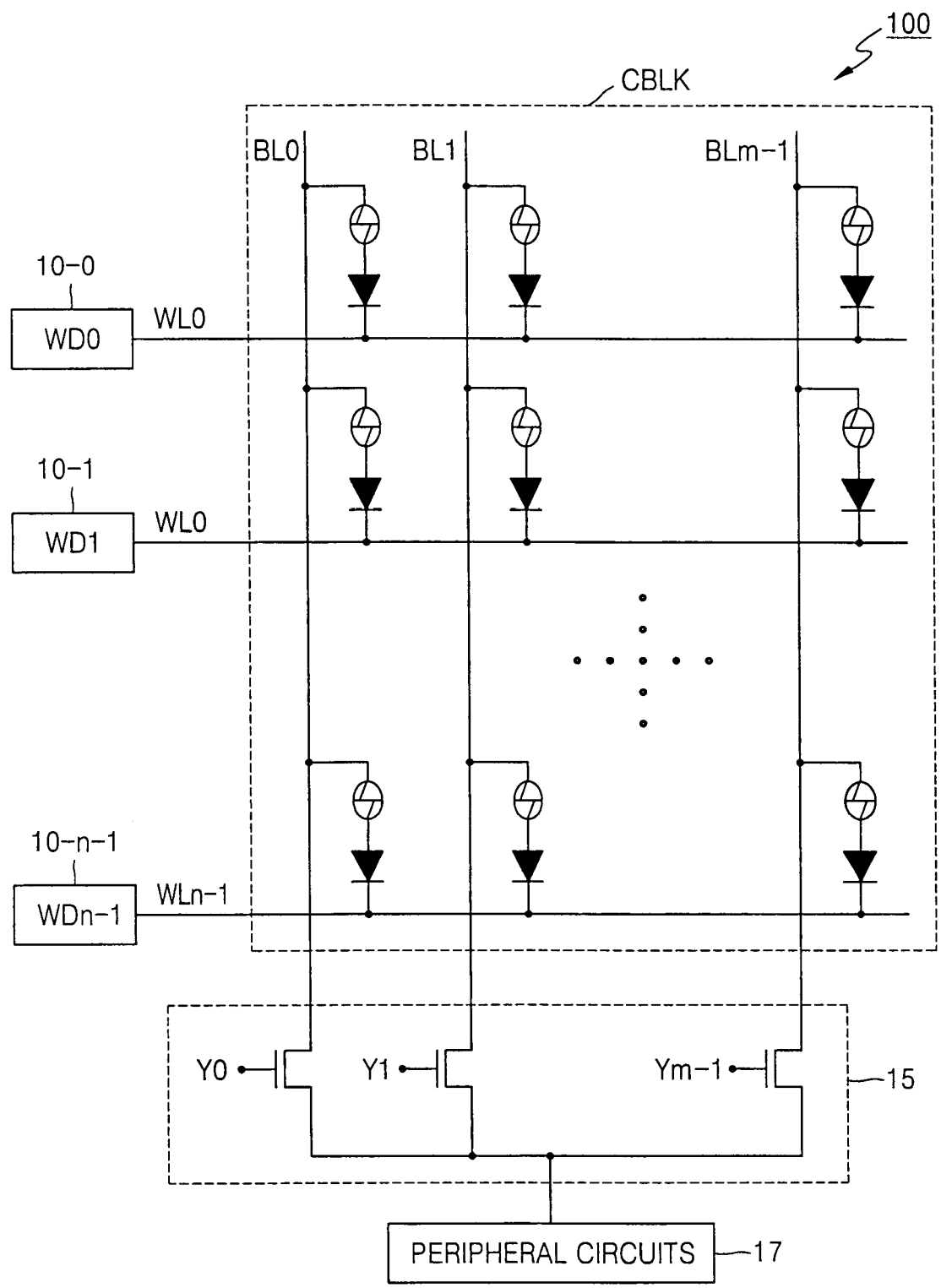
FIG. 2 is a simplified circuit diagram of a phase change memory device having an array of the unit memory cells shown in FIG. 1.
Figure 3:
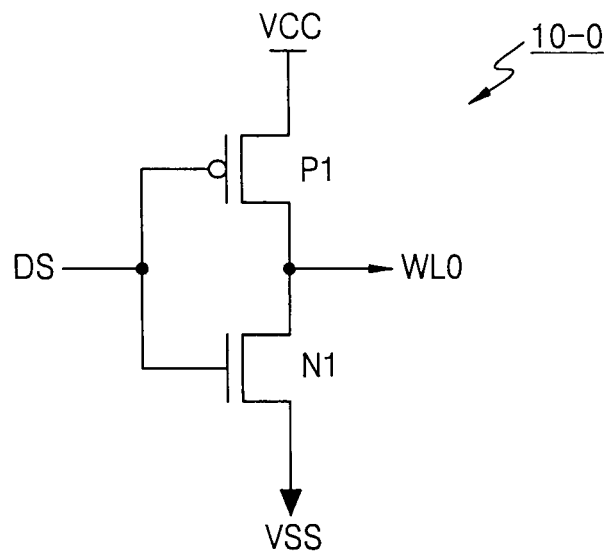
FIG. 3 is a circuit diagram of a word line drive circuit shown in FIG. 2.

The word line drive circuit of FIG. 4 may be utilized as each of the word line drive circuits WD0~WDn−1 of the phase change memory device of previously discussed FIG. 2. In such a case, the phase change memory device includes a plurality of unit memory cells each having a phase change element GST and a diode D. However, as will be understood by those skilled in the art, other unit cell configurations are known (some without diodes) to which the word line drive circuits of embodiments of the present invention may be applied.

In the example of this embodiment, the mode selector 25 is a PMOS transistor P2 that is turned on or off in response to a second control signal /CE. In particular, the second control signal /CE turns the MOS transistor P2 on during the normal operational mode, and turns the MOS transistor P2 off during the standby operational mode. The second control signal /CE may be, for example, a chip enable signal.

As will be understood by those skilled in the art, the PMOS transistor P2 is just one example of devices capable of selectively applying the first voltage level VCC to the drive unit 23.

The drive unit 23 of this example includes a first NMOS transistor N1 connected between a second voltage level VSS and a corresponding word line WL, and a second PMOS transistor P1 connected between the corresponding word line WL and the mode selector 25. The gates of each of the transistors P1 and N1 are connect to receive a first control signal DS. The first control signal DS is, for example, a decoded address signal from a row decoder (not shown).

As will be understood by those skilled in the art, the PMOS transistor P1 and the NMOS transistor N1 are just one example of devices capable of selectively applying the power voltage VCC or the ground voltage VSS to the corresponding word line WL.

During the normal operational mode, the second control signal /CE is generated as a low level voltage, and the MOS transistor P2 of the mode selector 25 is thus turned on to apply the power voltage VCC to the drive unit 23. In this state, when the word line WL is a selected word line, the first control signal DS has a high level so that the second low voltage level VSS is applied to the word line WL. On the other hand, when the word line WL is a non-selected word line, the first control signal DS is a low level signal so that the first high voltage level VCC is applied to the word line WL. Also, in the case where the word line drive circuit 20 is utilized in the phase change memory device of FIG. 2, a high voltage level is applied to a selected bit line (e.g., bit line BL1), and a low voltage level is applied to the remaining non-selected bit lines (e.g., bit lines BL0 and BL2~BLm−1). In this manner, a selected unit memory cell C is subjected to a write or read operation during the normal operational mode.

During the standby operational mode, the second control signal /CE is generated as a high level signal, and accordingly, the PMOS transistor P2 of the mode selector 25 is turned off to block the supply of the first high voltage level VCC to the drive unit 23. As such, leakage induced power consumption in the standby operational mode is reduced.

To further reduce leakage current, the decoded signal DS is preferably set to a low state (for example, a ground state) in the standby operational mode, in which case the corresponding word line WL will be placed in a floating voltage state. Also preferably, all of the word lines WL0~WLn−1 are placed in a floating voltage state during the standby operational mode.

In addition, each of the bit lines BL0~BLm−1 is preferably maintained in a low level voltage state (for example, a ground voltage) during the standby operational mode, thus further reducing power consumption.

Figure 5:
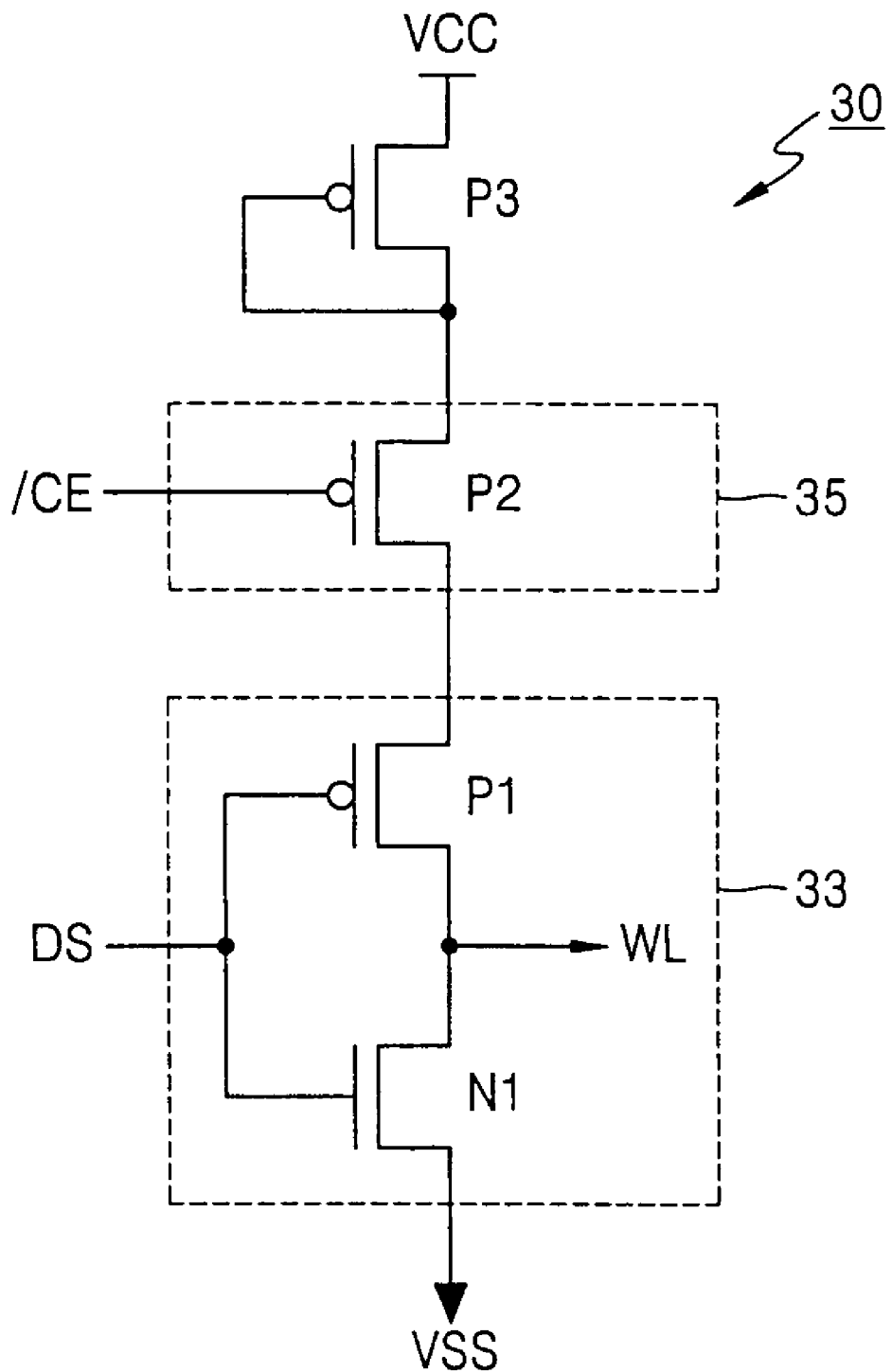
FIG. 5 is a circuit diagram of a word line drive circuit according to another embodiment of the present invention.

FIG. 5 is a circuit diagram of a word line drive 30 circuit according to another embodiment of the present invention. As shown, the word line drive circuit 30 includes a drive unit 33, a mode selector 35, and a diode-connected transistor P3 connected between the mode selector 35 and the first voltage VCC.

The drive unit 33 and the mode selector 35 have the same structure and function as the drive unit 23 and the mode selector 25, respectively, of the previous embodiment of FIG. 4. Accordingly, a detailed description of the normal and standby operational modes of the drive unit 33 and the mode selector 35 is omitted here to avoid redundancy.

The embodiment of FIG. 5 differs from that of FIG. 4 by the inclusion of the diode-connected transistor P3. The diode-connected transistor P3 is effective in reducing leakage current in the normal operational mode. That is, the voltage of the non-selected word lines WL is reduced to VCC−Vth during the normal operational mode, where Vth is the threshold voltage of the diode-connected transistor P3. The reduced selected word line WL voltage results in reduced leakage current in the normal operational mode, which in turn results in reduced power consumption.

Figure 6:
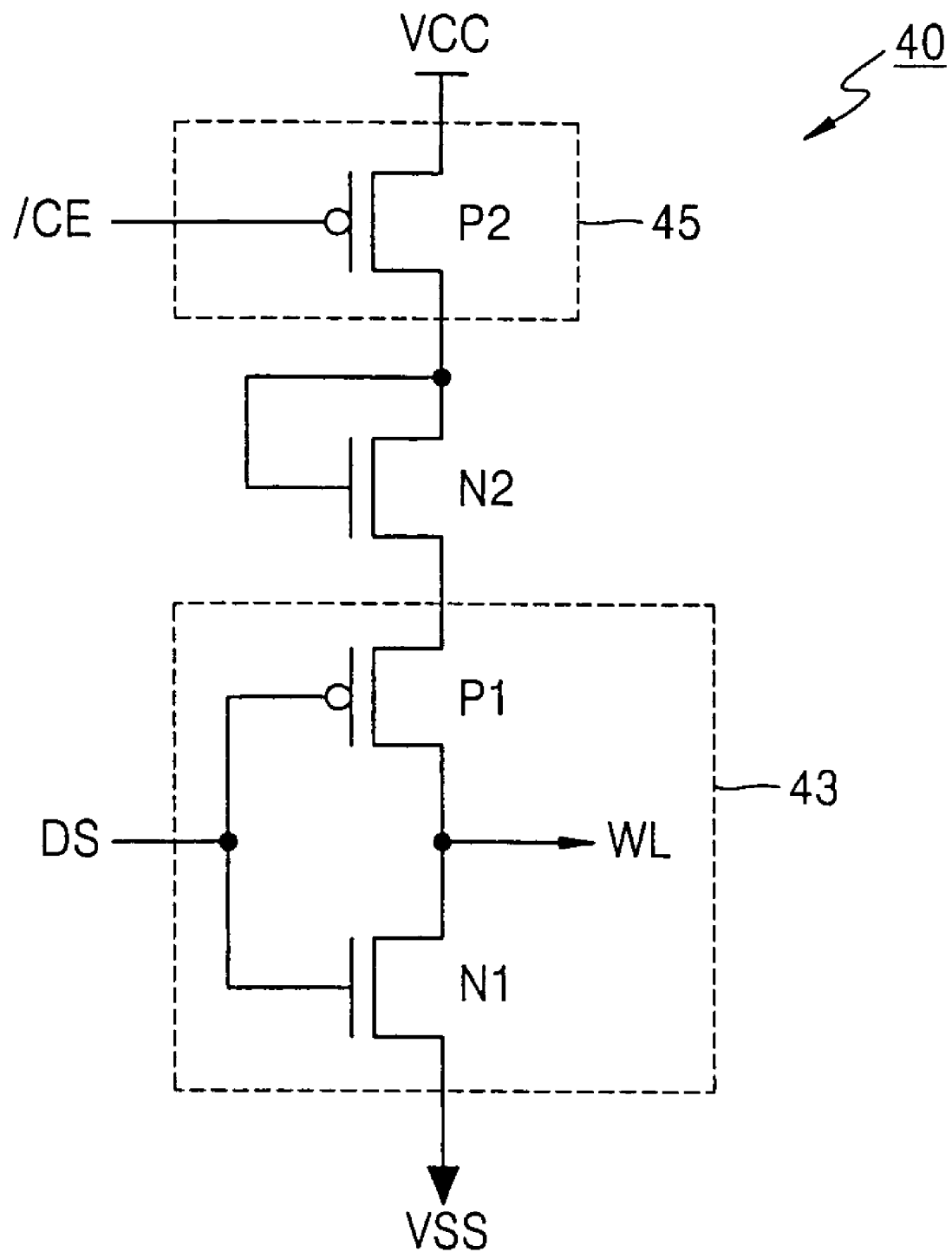
FIG. 6 is a circuit diagram of a word line drive circuit according to still another embodiment of the present invention.

FIG. 6 is a circuit diagram of a word line drive circuit according to still another embodiment of the present invention. As shown, the word line drive circuit 40 includes a drive unit 43, a mode selector 45, and a diode-connected transistor N2 connected between the mode selector 45 and the drive unit 43.

The drive unit 43 and the mode selector 45 have the same structure and function as the drive unit 23 and the mode selector 25, respectively, of the previous embodiment of FIG. 4. Accordingly, a detailed description of the normal and standby operational modes of the drive unit 43 and the mode selector 45 is omitted here to avoid redundancy.

The embodiment of FIG. 6 differs from that of FIG. 4 by the inclusion of the diode-connected transistor N2. The diode-connected transistor N2 is effective in reducing leakage current in the normal operational mode. That is, the voltage of the non-selected word lines WL is reduced to VCC−Vth during the normal operational mode, where Vth is the threshold voltage of the diode-connected transistor N2. The reduced selected word line WL voltage results in reduced leakage current in the normal operational mode, which in turn results in reduced power consumption.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A method of driving a phase change memory device having a plurality of word lines, the method comprising:
   applying a first voltage level to non-selected word lines and a second voltage level to selected word lines in response to a first control signal via a drive unit during a normal operational mode; and
   blocking a supply of the first voltage level to the drive unit in response to a second control signal and setting the first control signal to a state corresponding to the first voltage level for the non-selected word lines, placing each of the plurality of word lines in a floating state during a standby operational mode.

2. The method of claim 1, the phase change memory device further having a plurality of bit lines, the method further comprising:
   applying the first voltage level to selected bit lines and the second voltage level to non-selected bit lines during the normal operational mode; and
   applying the second voltage level to the bit lines during the standby operational mode, reducing power consumption during the standby operational mode,
   wherein the first voltage level is higher than the second voltage level.

3. The method of claim 1, wherein the first voltage level is a power voltage level, and the second voltage level is a ground voltage level.

4. The method of claim 1, wherein the first voltage level is lower than a power voltage level and higher than the second voltage level, and the second voltage level is a ground voltage level.

5. The method of claim 1, wherein the phase change memory device includes a plurality of memory cells each including a diode and a phase change memory element.

6. A phase change memory device including a plurality of word line drive circuits for driving corresponding word lines, each of the plurality of word line drive circuits comprising:
   a drive unit which sets a corresponding word line to a first voltage level, when the corresponding word line is non-selected, and which sets the corresponding word line to a second voltage level, when the corresponding word line is selected, in response to a first control signal during a normal operational mode of the phase change memory device; and
   a mode selector which supplies the first voltage level to the drive unit during the normal operational mode of the phase change memory device,
   wherein, during a standby operational mode, the mode selector stops supplying the first voltage level to the drive unit and the first control signal is set to a first level corresponding to the first voltage level, placing each of the plurality of word lines in a floating state.

7. The phase change memory device of claim 6, wherein the mode selector comprises a MOS transistor, which is turned on during the normal operational mode and turned off during the standby operational mode in response to the second control signal.

8. The phase change memory device of claim 7, wherein the second control signal is a chip enable signal.

9. The phase change memory device of claim 7, wherein the drive unit comprises:
   a first transistor connected between a ground voltage and the corresponding word line; and
   a second transistor connected between the MOS transistor and the corresponding word line,
   wherein gates of the first and second transistors receive the first control signal.

10. The phase change memory device of claim 9, wherein the first transistor is an NMOS transistor, and the second transistor and the MOS transistor are PMOS transistors.

11. The phase change memory device of claim 10, further comprising a diode-connected transistor connected between the first voltage level and the MOS transistor.

12. The phase change memory device of claim 10, further comprising a diode-connected transistor connected between the second transistor and the MOS transistor.

13. The phase change memory device of claim 6, wherein the first voltage level is lower than a power voltage level and higher than the second voltage level, and the second voltage level is a ground voltage level.

14. The phase change memory device of claim 7, wherein the first control signal is a decoded address signal.

* * * * *